United States Patent
Avanzino et al.

(10) Patent No.: US 7,288,782 B1
(45) Date of Patent: Oct. 30, 2007

(54) USE OF TA-CAPPED METAL LINE TO IMPROVE FORMATION OF MEMORY ELEMENT FILMS

(75) Inventors: Steven C. Avanzino, Cupertino, CA (US); Amit P. Marathe, Milpitas, CA (US)

(73) Assignees: Spansion LLC, Sunnyvale, CA (US); Advanced Micro Devices, Inc., Austin, TX (US)

( * ) Notice: Subject to any disclaimer, the term of this patent is extended or adjusted under 35 U.S.C. 154(b) by 36 days.

(21) Appl. No.: 11/251,291

(22) Filed: Oct. 14, 2005

Related U.S. Application Data

(62) Division of application No. 11/033,653, filed on Jan. 12, 2005, now Pat. No. 7,084,062.

(51) Int. Cl.
*H01L 47/00* (2006.01)

(52) U.S. Cl. .................. 257/4; 257/2; 257/40; 365/148; 365/163; 365/174

(58) Field of Classification Search ............ None
See application file for complete search history.

(56) References Cited

U.S. PATENT DOCUMENTS

| | | |
|---|---|---|
| 6,656,763 B1 | 12/2003 | Oglesby et al. |
| 6,686,263 B1 | 2/2004 | Lopatin et al. |
| 6,746,971 B1 | 6/2004 | Ngo et al. |
| 6,753,247 B1 | 6/2004 | Okoroanyanwu et al. |
| 6,768,157 B2 | 7/2004 | Krieger et al. |
| 6,770,905 B1 | 8/2004 | Buynoski et al. |
| 6,773,954 B1 | 8/2004 | Subramanian et al. |
| 6,781,868 B2 | 8/2004 | Bulovic et al. |
| 6,787,458 B1 | 9/2004 | Tripsas et al. |
| 6,803,267 B1 | 10/2004 | Subramanian et al. |
| 6,825,060 B1 | 11/2004 | Lyons et al. |
| 6,852,586 B1 | 2/2005 | Buynoski et al. |
| 6,858,481 B2 | 2/2005 | Krieger et al. |
| 6,864,522 B2 | 3/2005 | Krieger et al. |
| 6,878,961 B2 | 4/2005 | Lyons et al. |
| 7,129,133 B1 * | 10/2006 | Avanzino et al. ........... 438/244 |

* cited by examiner

*Primary Examiner*—Evan Pert
*Assistant Examiner*—Tan Tran
(74) *Attorney, Agent, or Firm*—Amin, Turocy & Calvin, LLP

(57) ABSTRACT

Disclosed are methods for deposition of improved memory element films for semiconductor devices. The methods involve providing a hard mask over an upper surface of a metal line of a semiconductor substrate where vias are to be placed, recess etching the mask substantially in all upper surfaces except where vias are to be placed, depositing a Ta-containing capping layer over substantially all the metal line surfaces except the surface where vias are to be placed, polishing the Ta-containing capping layer to produce a damascened Ta-containing cap while exposing the metal line at the via forming surface, depositing a dielectric layer, patterning the dielectric layer to form a via, and depositing memory element films. The improved Ta—Cu interface of the subject invention mitigates and/or eliminates lateral growth of memory element films and copper voiding under the dielectric layer at the top surface of the metal line, and thereby enhances reliability and performance of semiconductor devices.

19 Claims, 9 Drawing Sheets

USE OF TA-CAPPED METAL LINE TO IMPROVE FORMATION OF MEMORY ELEMENT FILMS

CROSS REFERENCE TO RELATED APPLICATION

This application is a Divisional application of U.S. application Ser. No. 11/033,653, entitled USE OF TA-CAPPED METAL LINE TO IMPROVE FORMATION OF MEMORY ELEMENT FILMS and filed on Jan. 12, 2005 now U.S. Pat. No. 7,084,062, the entirety of which is incorporated herein by reference.

TECHNICAL FIELD

The subject invention generally relates to semiconductor fabrication. More particularly, the subject invention relates to methods and systems for forming efficient memory element films in a via without excessive lateral growth and copper void formation.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed. Electronic addressing or logic devices, for instance, for storage or processing of data, are made with inorganic solid state technology, and particularly crystalline silicon devices.

Much of the progress in making computers and memory devices faster, smaller and less expensive involves integration, squeezing ever more transistors and other electronic structures onto a postage stamp sized piece of silicon. A postage stamp sized piece of silicon may contain tens of millions of transistors, each transistor as small as a few hundred nanometers. The escalating requirements for high density and performance associated with ultra large-scale integration require responsive changes in semiconductor technology.

In recent years copper (Cu) has emerged as an alternative to aluminum (Al) for metallization patterns, particularly for interconnect systems having smaller dimensions. Despite the beneficial properties of copper, copper usage in large scale semiconductor manufacturing raises some concerns which need to be addressed. For example, copper interconnects affect memory element film deposition and thereby, influence performance of semiconductor devices.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention exhibits advantageous features compared to conventional methods of memory element formation. The subject invention provides methods and structures for mitigating and/or eliminating the lateral growth of a memory element film along the top surface of the metal line that is under a dielectric layer. Also, the subject invention mitigates and/or eliminates the formation of copper voids resulting from the migration of copper atoms at the interface of a dielectric layer and a metal line. Thus, the subject invention advantageously facilitates manufacture of reliable and cost effective semiconductor devices.

In one aspect of the subject invention, methods are provided for mitigating and/or eliminating lateral growth of memory element films and copper voiding under a dielectric layer during fabrication of a semiconductor device. The methods include forming a metal line on a semiconductor substrate, providing a patterned hard mask over an upper surface of the metal line where vias are to be placed, exposing substantially all other upper surfaces of the metal line to a copper recess etch, depositing a tantalum (Ta) containing capping layer, depositing a dielectric layer over substantially all the upper surface of the metal line including the Ta-containing cap layer and the mask area, patterning a via in the dielectric layer, and depositing memory element films.

In another aspect of the subject invention, memory cells are provided which exhibit improved memory element properties, and thereby, improved memory cell performance. The structures contain a bottom electrode formed in a first dielectric of a semiconductor substrate, a Ta-containing cap layer over a portion of the bottom electrode, a second dielectric layer over the Ta-containing cap layer, memory element films in a via in the second dielectric layer and contacting the bottom electrode, and a top electrode over the memory element films. The Ta-containing cap layer contributes to the improved memory element properties.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The subject invention relates to methods and structures that mitigate and/or eliminate excessive lateral growth of memory element films and copper void formation under a dielectric layer of a semiconductor device. The methods involve using a tantalum (Ta) containing cap layer over substantially all metal line surfaces except those on which vias are to be placed. The inventors have found that, in some instances, the resulting Ta—Cu interface at the metal line surface provides a poor pathway for Cu atom migration, and thereby enhances the quality of memory element films deposited at the bottom of the via by mitigating Cu atom migration.

Copper is being increasingly used in metallization processes. The beneficial electrical properties of copper are useful in sub micron level semiconductor manufacturing. For example, copper has lower bulk resistivity and higher electromigration compared to aluminum, both of which provide significant benefits over aluminum. However, one of the concerns with the use of copper is that copper readily diffuses into conventional silicon based dielectric materials, and silicon based etch stop layers, such as silicon dioxide and silicon nitride. Once copper atoms dope dielectric material or etch-stop layers (that is, undesirably migrate therein), dielectric materials cease to function properly and/or significantly degrade in performance. Also, migration of copper atoms into surrounding layers can result in void formation that degrades semiconductor device performance by causing short circuit and/or current leakage. The inventors have observed that, in some instances, these problems associated with the use of copper may result in undesirable lateral growth of memory element films formed at the top surface of a copper metal line under an overlying dielectric layer.

The subject invention may be understood and its advantages appreciated in conjunction with the figures and drawings, wherein like numerals represent like features throughout.

Figure 1:
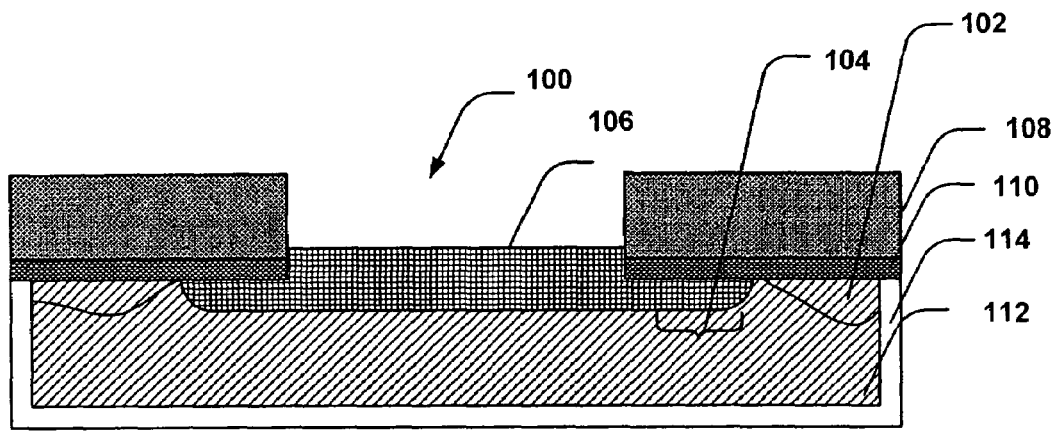
FIG. 1 is a cross sectional view of a memory cell illustrating excessive lateral growth of a memory element film, and copper void formation under a dielectric layer.

Silicon based etch stop layers such as silicon nitride are used between a metal line and an overlying dielectric layer. However, using silicon based etch stop layers may result in large lateral growth of memory element films along the top of the metal line under the overlying dielectric layer. FIG. 1 is a cross sectional depiction of a semiconductor device 100 during a stage of fabrication illustrating both the formation of copper voids 102 and the excessive lateral growth 104 of a memory element film 106 under a dielectric layer 108. FIG. 1 also shows the presence of an etch stop layer 110 on the surface of a copper containing metal line 112 and a barrier layer 114 covering other surfaces of the metal line.

Figure 2:
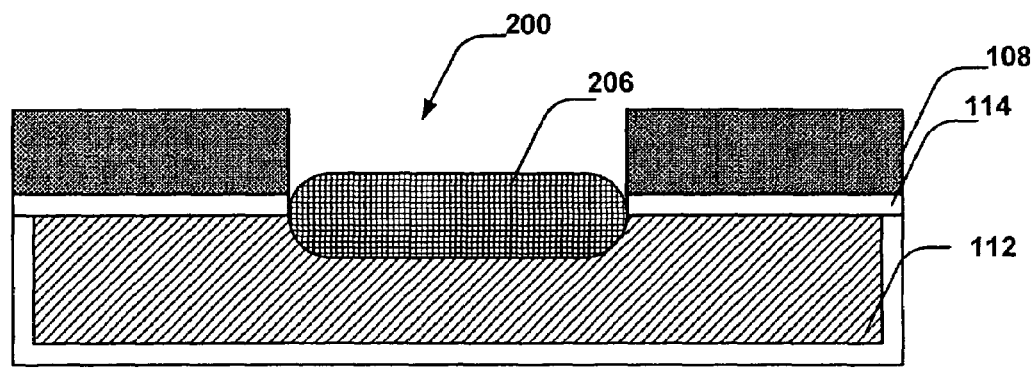
FIG. 2 is a cross sectional illustration of a memory cell undergoing fabrication according to one aspect of the subject invention showing absence of both the lateral growth of memory element films and copper void formation.

The subject invention advantageously mitigates and/or eliminates the excessive lateral growth of memory element films and/or copper voiding under an overlying dielectric layer by providing a Ta-containing cap over substantially all upper surfaces of a metal line except those surfaces on which vias are to be placed. It is believed that the Ta—Cu interface at the metal line surface prevents diffusion of copper atoms, thus mitigating and/or eliminating excessive lateral growth of memory element films and/or copper voiding under the overlying dielectric layer. FIG. 2 is a cross sectional illustration of a semiconductor device 200 during a stage of fabrication according to one aspect of the subject invention showing improved formation of a memory element film and absence of voids under a dielectric layer. FIG. 2 further shows the presence of a Ta-containing cap layer 114 on all surfaces of metal line 112 except where vias are to be placed.

The other features shown in FIG. 2 include a properly deposited memory film 206 and a dielectric layer 108 overlying the metal line 112.

Figure 3:
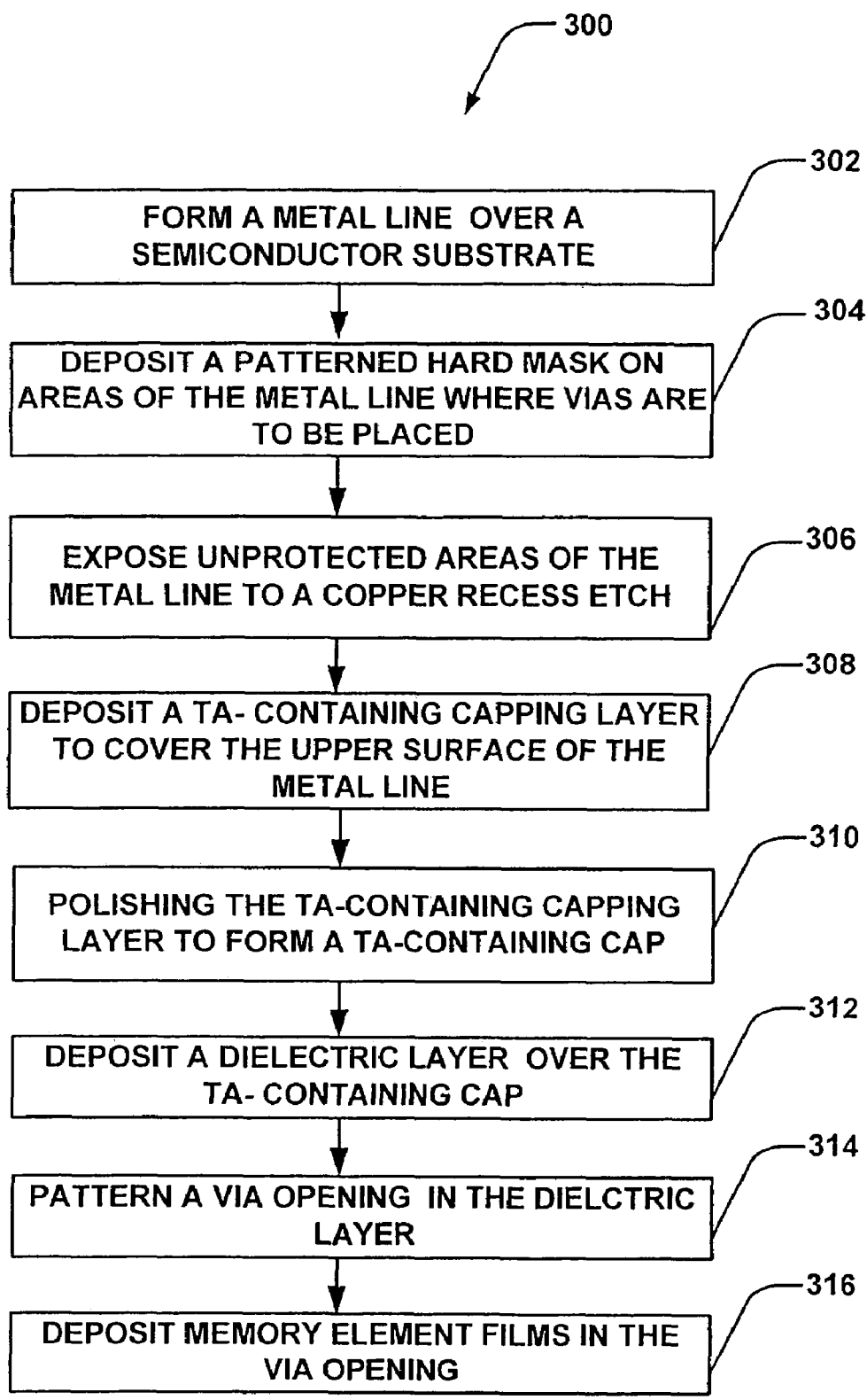
FIG. 3 is a flow chart showing an exemplary methodology for carrying out one aspect of the subject invention.

Referring to FIG. 3, a flow chart of an exemplary methodology 300, for carrying out an aspect of the subject invention to improve the deposition of memory element films, is shown. The method 300 involves forming a metal line on a semiconductor substrate (act 302), depositing a patterned hard mask over an upper surface of the metal line where vias are to be placed (act 304), recessing all other upper surfaces of the metal line which are not covered with the hard mask (act 306), depositing a Ta-containing capping layer to cover all the upper surface of the metal line including the hard mask covered area (act 308), polishing the Ta-containing capping layer to produce a damascened Ta-containing cap while exposing the metal line at via placing area (act 310), depositing a dielectric layer over the Ta-containing cap layer and the exposed portion of the metal line (act 312), patterning a via in the dielectric layer (act 314), and depositing memory element films in the via (act 316). FIGS. 4-13 depict a semiconductor substrate undergoing various stages of fabrication according to method 300 of the subject invention.

For simplicity of explanation, the methods are depicted and described as a series of acts. Also, the drawings and figures are only for illustrative purposes only and as such do not represent drawings and figures drawn to a scale. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art understand and appreciate that the methodologies may alternatively be represented as a series of interrelated states via a state diagram or events.

Figure 4:
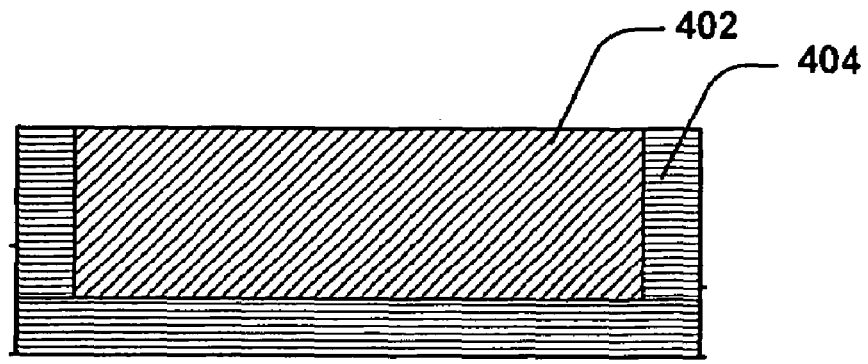
FIGS. 4-13 are cross sectional illustrations of various stages of a semiconductor substrate of a semiconductor device undergoing fabrication according to one aspect of the subject invention.

Referring to FIG. 3, act 302 of method 300 is forming a metal line on a semiconductor substrate of a semiconductor device undergoing fabrication. FIG. 4 is a cross sectional illustration of a metal line 402 formed on a substrate, and shows the metal line 402 surrounded on three sides by a barrier layer 404.

The semiconductor substrate on which the metal line 402 is formed can be any substrate used in the course of semiconductor processing or any semiconductor surface. The substrate is formed using methods known to one skilled in the art. Examples of substrates for the subject invention include semiconductor materials such as gallium arsenide (GaAs), germanium, silicon, silicon germanium, lithium niobate, and compositions containing silicon such as crystalline silicon, polysilicon, amorphous silicon, epitaxial silicon, silicon dioxide ($SiO_2$), and combinations thereof. Typically, the substrate is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The substrate is not shown in the figures and drawings for simplification and brevity.

A barrier layer 404 may be formed over the substrate of the subject invention before forming the metal line 402. Any barrier metal can be used for forming the barrier layer 404. For example, tantalum, tantalum nitride, tungsten, tungsten nitride, titanium, titanium nitride and combinations thereof can be used to form the barrier layer 404. In one embodiment of the subject invention, the barrier layer 404 contains tantalum. In another embodiment of the subject invention, the barrier layer 404 includes compounds and alloys of tantalum. Examples include Ta nitride, Ta oxide, Ta sulfide, Ta carbide, TaW, TaTi, and the like.

The barrier layer 404 may be formed using suitable deposition techniques that are well known to persons skilled in the art. For example, chemical vapor deposition (CVD), physical vapor deposition (PVD), plasma enhanced chemical vapor deposition (PECVD), low pressure chemical vapor deposition (LPCVD), high pressure chemical vapor deposition (HPCVD), sputtering, spin-coating, and the like can be used. The thickness of the barrier layer 404 can be adjusted to desirable levels. The thickness of the barrier layer 404 can range from about 1 Å to about 100 Å. Optionally, the barrier layer 404 can be polished to planarize the surface. The polishing can be done by any suitable technique.

The metal line 402 can contain any copper containing metal. For example, the materials for the metal line 402 can include copper, copper alloys and the like. In one embodiment of the subject invention, the metal line is made of copper.

The metal line 402 can be formed on the substrate by any suitable technique. Examples of techniques for forming metal line 402 include electroplating, electroless plating, sputtering, evaporation, CVD, PVD, spin-coating and the like. The dimensions of the metal line 402 can vary depending on particular design needs, and still be within the scope of the subject invention.

According to one example, the formation of the metal line 402 may involve depositing a copper seed layer over the semiconductor substrate which has been covered with a barrier layer, coating the semiconductor substrate and the copper seed layer with a resist, patterning the resist coating, plating with copper, and stripping the resist to form the metal line.

The metal line 402 can also be formed by many other methods that are well known to persons skilled in the art. For example, the metal line 402 can be formed within openings defined by a dielectric layer. In another example, the metal line 402 may be formed without using a copper seed layer. It is to be appreciated that other known methods of forming metal lines are within the scope of the subject invention.

The sidewalls of the metal line 402 can be coated with a barrier layer. The barrier layer formed over the sidewalls of the metal line can be the same or different from that of the barrier layer 404. In one embodiment of the subject invention, the barrier layer surrounding the sidewalls of the metal line is identical to the barrier layer 404. FIG. 4 shows a barrier layer on the sidewalls of the metal lie 402 which is identical to the barrier layer 404. A diffusion barrier can be desirable to prevent copper from diffusing into a dielectric subsequently formed adjacent to the copper.

Referring back to FIG. 3, act 304 is depositing a patterned hard mask 505 over an upper surface of the metal line 402 where vias are to be placed. Any hard mask material can be used. For example, materials such as silicon nitride, silicon carbide, silicon oxide, silicon oxynitride and the like can be used as hard mask layer 505.

Figure 5:
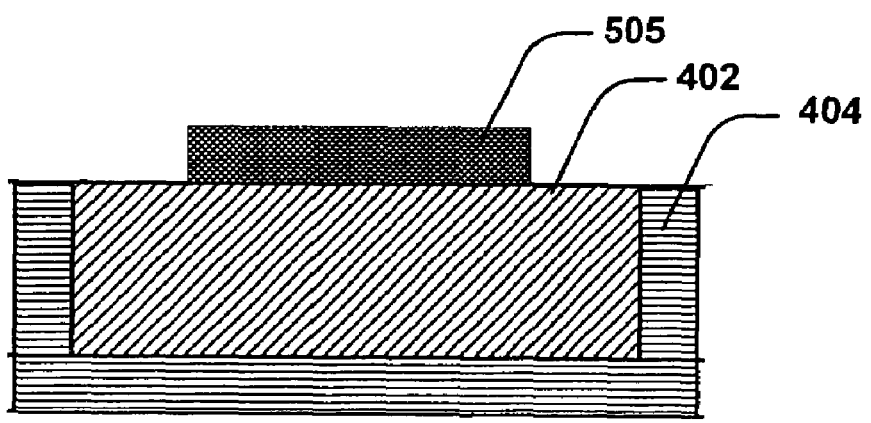

FIG. 5 is a cross sectional illustration of the hard mask 505 formed on the metal line 402. The hard mask layer is deposited using suitable methods. For example, hard mask layer 505 can be deposited using CVD, PECVD, and the like. Optionally, the hard mask can be heated.

The hard mask can be of any suitable thickness to facilitate both protection of underlying areas and also further fabrication procedures. The thickness of the hard mask 505 can range from about 10 Å to about 1000 Å. Optionally, prior to forming the hard mask, blocking or etch stop layers can be used.

Figure 6:
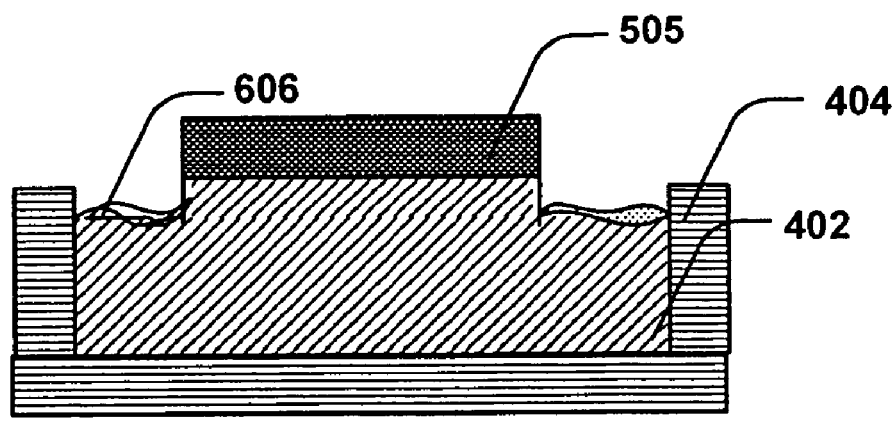

Referring back to FIG. 3, act 306 of method 300 is recessing substantially all the upper surface of the metal line 402 except the upper surface of the metal line 402 that is covered by the hard mask 505. FIG. 6 is a cross sectional illustration of a semiconductor device undergoing fabrication according to one aspect of the subject invention, showing the recessed portion of the metal line 606 along with the hard mask 505, the barrier layer 404 and unrecessed portion of the metal line 402.

Any suitable method can be used to recess the upper surface of the metal line 402. For example, a copper recess etch can be used. Etching can be through either a wet etch or a dry etch. In one embodiment of the subject invention, the copper recess is carried out by using a plasma etch, wet etch, or electro polishing. In another embodiment of the subject invention, the copper recess etch is carried out using a reactive ion etching process. In yet another embodiment, the copper recess etch is carried out using a wet etchant in a spin-etch process. The etch is followed by a cleaning act.

The etchant chemistry employed to recess the metal line 402 depends on the etch requirements and the constituents of the metal line. In one embodiment, a peroxide based etchant is used. In another embodiment, an acid based etchant is used. In yet another embodiment, an etchant containing both an acid and a peroxide is used. For example, a mixture of sulfuric acid and hydrogen peroxide can be used as a wet etchant. In one more embodiment, an etchant containing halogen compounds is used.

The etch rate can be adjusted to obtain proper etching. In one example, an etch rate from about 0.5 to about 10 µm/min is employed. The etching can be either isotropic or anisotropic. The temperature at which the etch is carried out ranges from about 10° C. to about 100° C.

The amount of copper to be recessed is determined by the fabrication requirements of subsequently formed layers, such as memory element films and top electrode. In one embodiment, the recess is from about 1 Å to about 1000 Å in depth and is approximately from about 1/16 to about 1/4 the depth of the metal line 402. In another embodiment of the subject invention, the upper surface of the metal line is recessed to a depth from about 10 Å to about 500 Å. In yet another embodiment of the subject invention, the metal line 402 is recessed to a level sufficient to form a capping layer.

Figure 7:
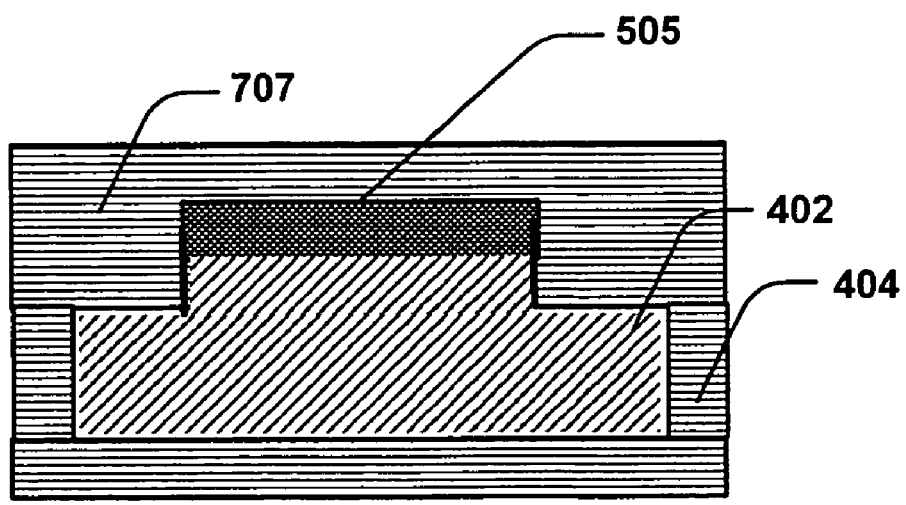

Referring back to FIG. 3, act 308 is depositing a Ta-containing capping layer 707 over the upper surface of the metal line 402. FIG. 7 depicts the formation of a Ta-containing capping layer 707 on the upper surface of the metal line 402. The Ta-containing capping layer 707 can be deposited using any suitable method to cover substantially all the upper surface of the metal line 402, including the upper surface of the metal line covered by the hard mask 505. For example, the Ta-containing capping layer 707 can be formed by deposition techniques such as CVD, PVD, PECVD, LPCVD, sputtering, evaporation, or electroplating.

The Ta-containing capping layer 707 can be made of any Ta-containing materials. In one embodiment of the subject invention, the Ta-containing capping layer 707 comprises tantalum. In another embodiment of the subject invention, alpha-Ta, beta Ta, alpha-beta Ta, compounds of Ta or alloys containing Ta are used as the Ta-containing capping layer 707. Examples of compounds of Ta include tantalum oxide, tantalum sulfide, tantalum nitride, tantalum-tungsten, tantalum-titanium, and the like.

The Ta-containing capping layer 707 can be of any suitable thickness depending on the lithographic and design needs. In one embodiment of the subject invention, the thickness of the Ta-containing capping layer 707 can be from about 1 Å to about 1000 Å. In another embodiment of the subject invention, the thickness of the Ta-containing capping layer can be from about 5 Å to about 500 Å.

Figure 8:
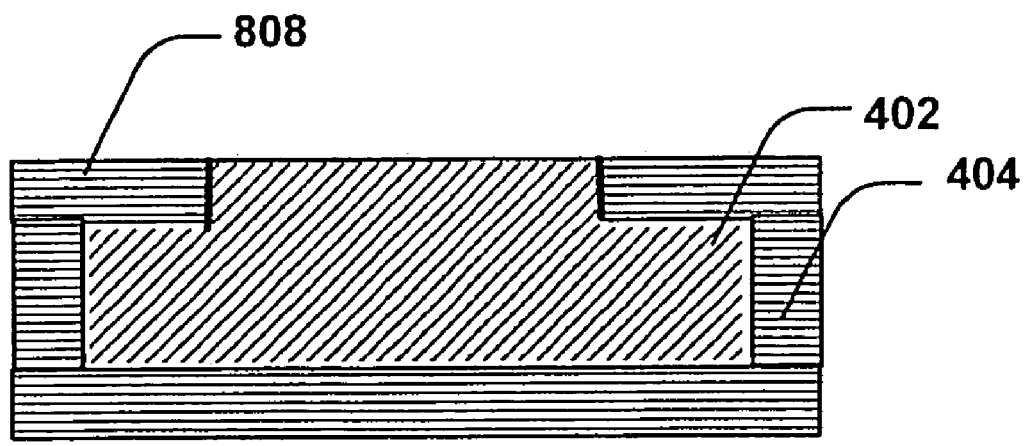

Referring back to FIG. 3, act 310 of method 300 is polishing the Ta-containing capping layer 707 along with the hard mask 505 to form a damascened Ta-containing cap and also to expose fresh copper at the upper metal line surface. The polishing results in a damascened Ta-containing cap 808 on the upper surface of the metal line 402 along with a freshly exposed portion of the metal line 402 as shown in FIG. 8.

The polishing can be performed using any suitable method. For example, chemical, mechanical, or chemical mechanical polishing (CMP) can be used. The polishing techniques are well known to persons skilled in the art. Typically, CMP utilizes a polishing slurry containing an abrasive and a chemically active component. CMP slurry is selected such that the slurry exhibits significantly different removal rates for at least two different materials. CMP equipment and slurry materials are commercially available, and can be used to produce the damascened Ta-containing cap 808 of the subject invention.

The polishing is performed in such a way as to result in a Ta-containing cap with appropriate thickness. For example, in one embodiment of the subject invention, the Ta-containing cap 808 can have a thickness from about 1 Å to about 200 Å. In another embodiment, the thickness of the Ta-containing cap 808 is from about 5 Å to about 50 Å. In yet another embodiment of the subject invention, the Ta-containing cap 808 can have a thickness of about 20 Å. Optionally, a cleaning step may be performed to remove any undesirable material resulting from polishing.

Figure 9:
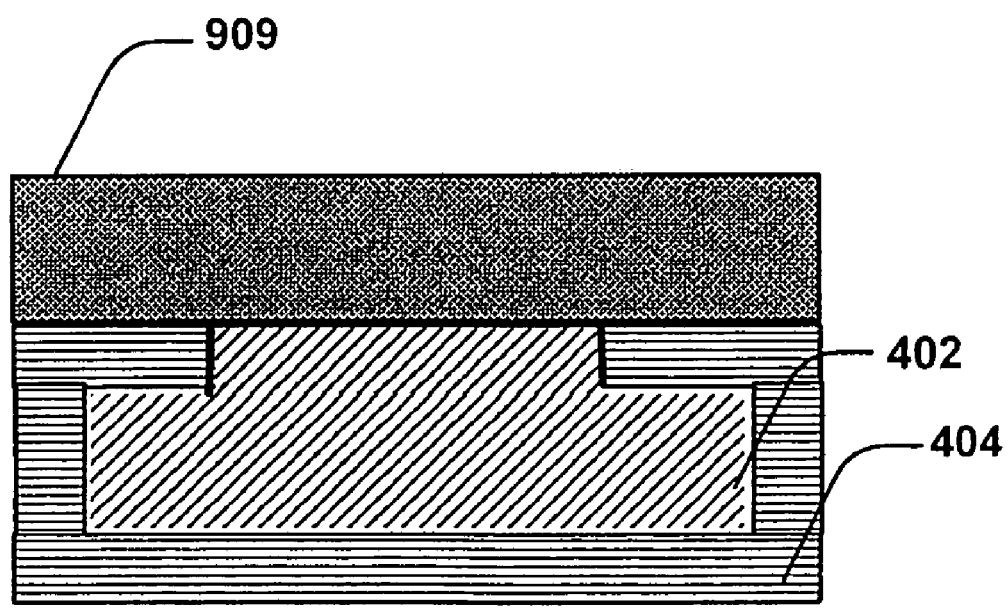

Referring back to FIG. 3, act 312 of method 300 is depositing a dielectric layer over the Ta-containing cap 808 and the exposed portion of the metal line 402. FIG. 9 is a cross sectional illustration of a dielectric layer 909 formed on the metal line 402 with the Ta-containing cap 808 and exposed portion of the metal line.

Any dielectric material can be used. Both organic and inorganic dielectric materials may be used. Similarly, both low and high k dielectrics may be used. Also polymeric, amorphous, crystalline and monomeric materials can be used as dielectric materials for this invention. Examples of dielectric materials include silicon containing spin-on glass such as alkoxysilane polymer, a siloxane polymer, a silsesquioxane polymer, a poly(arylene ether), a fluorinated poly(arylene ether), other polymer dielectrics, nanoporous silica or mixtures thereof.

Dielectric layer 909 can be formed by any suitable technique. For example, CVD, PECVD, or LPCVD, high pressure chemical vapor deposition (HPCVD) methods can be used. Polymeric dielectrics can also be formed by using spin-coating, dip-coating, spraying, or roller coating.

Dielectric layer 909 is deposited to a thickness appropriate to facilitate via formation and subsequent fabrication procedures. Typically, dielectrics are deposited to a thickness from about 1000 Å to about 50,000 Å.

Optionally, the dielectric layer 909 may be heated. Heating of the dielectric layer 909 may be conducted at a temperature from about 80° C. to about 500° C. The duration of heating of the dielectric layer 909 may range from about 1 minute to about 10 hrs.

Figure 10:
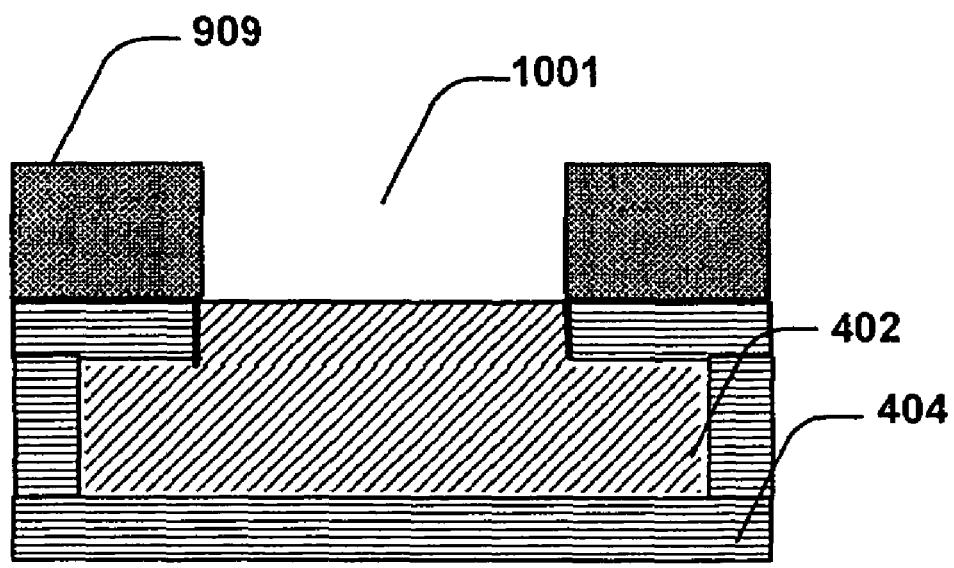

Referring back to FIG. 3, act 314 of method 300 is patterning a via in the dielectric layer 909 such that the via contacts the metal line 402 at the exposed portion of the metal line. FIG. 10 shows a cross sectional illustration of a via 1001 patterned in the dielectric layer 909 contacting the exposed portion of the metal line 402. Standard lithographic techniques can be used to form the via 1001.

Lithographic techniques for forming vias in a dielectric are well known in the art. Typically, patterning a via includes forming a mask layer over areas which need to be protected, forming a resist, exposing the resist, developing the resist and stripping the resist to form the via. Lithographic techniques can use both positive and negative resists, which are available commercially. After development, the resist is completely removed from the surface of the dielectric layer 909 and the inside walls of the via 1001 by plasma etching. The via 1001 can have relatively vertical sidewalls which extend perpendicular to the topological surface of the dielectric layer 909.

Optionally, a diffusion barrier layer can be formed on the side walls of the via before depositing memory element films. The methods and materials to form diffusion barrier layer are similar to the methods described earlier for formation of barrier layer 404 and can be used either with or without any modifications. The thickness of the diffusion barrier layer can be same or different to the thickness of the barrier layer 404.

Figure 11:
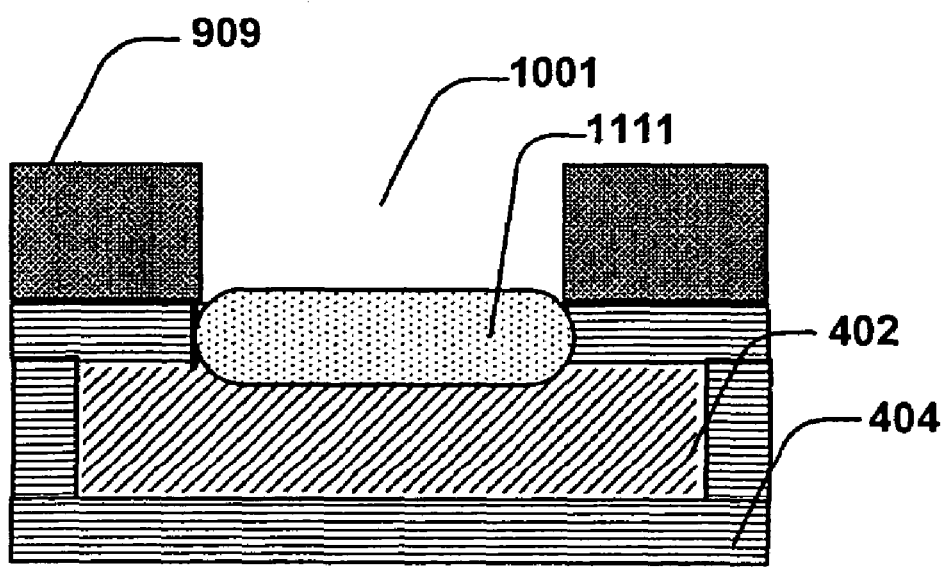

Referring back to FIG. 3, act 316 of method 300 is depositing memory element films in the via 1001. The memory element films include a passive layer 1111 and an active layer. FIG. 11 is a cross sectional illustration of a memory cell undergoing fabrication according to one aspect of the subject invention, and showing deposition of the passive layer 1111.

The passive layer 1111 is formed contacting the copper of the metal line 402. The passive layer 1111 can be made of at least one conductivity facilitating compound. Examples of conductivity facilitating compounds that may constitute the passive layer of the subject invention include one or more of copper sulfide ($Cu_2S$, CuS), copper rich copper sulfide ($Cu_3S$, CuS; $Cu_3S$, $Cu_2S$), copper oxide (CuO, $Cu_2O$), copper selenide ($Cu_2Se$, CuSe), and copper telluride ($Cu_2Te$, CuTe). Alternatively, the passive layer 1111 may be formed using conductivity facilitating compounds manganese oxide ($MnO_2$), titanium dioxide ($TiO_2$), indium oxide ($I_3O_4$), silver sulfide ($Ag_2S$, AgS), gold sulfide ($Au_2S$, AuS), iron oxide ($Fe_3O_4$), cobalt arsenide ($CoAs_2$), nickel arsenide (NiAs), and the like.

The conductivity facilitating compounds do not necessarily dissociate into ions under the strength of the electric field, although ions may move through them. The passive layer 1111 may contain two or more subpassive layers, each sublayer containing the same, different, or multiple conductivity facilitating compounds. FIG. 11 shows the passive layer of the subject invention without any copper voids and\or excessive lateral growth under the dielectric layer 909.

The passive layer 1111 is formed using oxidation techniques, via gas phase reactions, implantation techniques, or deposited. In some instances, the passive layer 1111 may be treated with a plasma after it is formed. The plasma treatment modifies the energy barrier of the passive layer 1111.

In one embodiment, the passive layer 1111 containing the conductivity facilitating compound has a thickness of about 2 Å or more. In another embodiment, the passive layer 1111 has a thickness of about 10 Å or more. In yet another embodiment, the passive layer 1111 has a thickness of about 50 Å or more.

Figure 12:
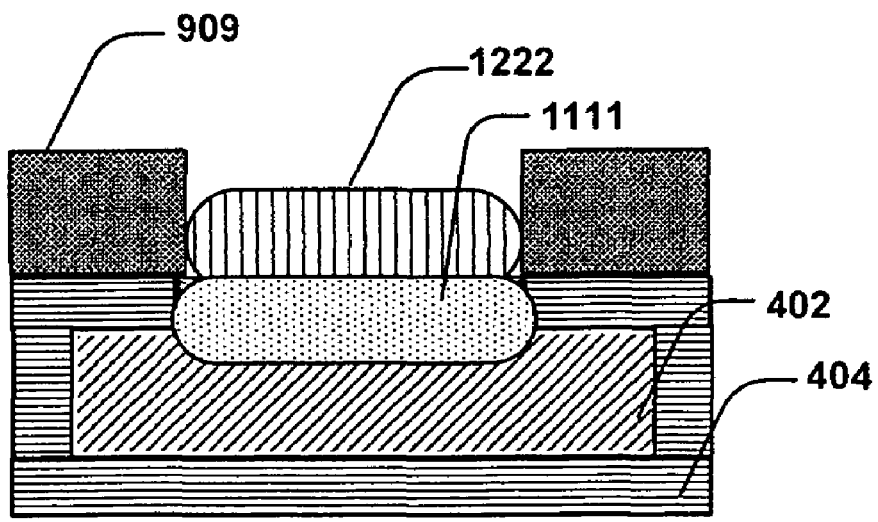

According to one aspect of the subject invention, the active layer of the subject invention can be formed using any suitable low conducting material. FIG. 12 is a cross sectional illustration of a semiconductor device undergoing fabrication according to one aspect of the subject invention and shows an active layer 1222 adjacent to the passive layer 1111. Examples of materials that can be used in the formation of the active layer 1222 include organic semiconducting materials, inorganic semiconducting materials, and mixtures of organic and inorganic semiconducting materials. The active layer can be formed using techniques well known to a person in the art.

General examples of the organic semiconducting materials include at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6-C60 carbon nanotubes), and the like.

General examples of the low conducting inorganic materials include transition metal sulfides, chalcogenides, and transition metal oxides. Examples of inorganic materials include cupper oxide (CuO, $Cu_2O$), iron oxide (FeO, $Fe_3O_4$), manganese oxide ($MnO_2$, $Mn_2O_3$, etc), titanium oxide ($TiO_2$).

The active layer can also contain a mixture of organic and inorganic materials. The inorganic material (transition metal oxide/sulfide) is usually embedded in an organic semiconductor material. Examples include polyphenylacetylene mixed with $Cu_2S$, polyphenylacetylene mixed with $Cu_2O$, and the like.

In one embodiment of the subject invention, the active layer is an organic semiconducting polymer layer. The organic semiconducting polymer layer can contain one or more semiconducting polymers. The organic semiconducting polymer layer can be formed by spin-on techniques (depositing a mixture of the polymer/polymer precursor and a solvent, then removing the solvent from the substrate/electrode), by CVD, optionally including a gas reaction, gas phase deposition, and the like. CVD includes LPCVD, PECVD, and HDCVD. During formation or deposition, the polymer material may self assemble. It is not typically necessary to functionalize one or more ends of the organic polymer in order to attach it to an electrode/passive layer. Examples of semiconducting polymers include conjugated organic polymers, organometallic polymers, carbon structures such as carbon nanotubes and buckyballs, and the like.

Examples of conjugated organic polymers include one or more of poly(p-phenylene vinylene); polyporphyrins; porphyrinic macrocycles, thiol-derivatized polyporphyrins; polymetallocenes such as polyferrocenes, polyphthalocyanines; polyvinylenes; polystiroles; polyacetylene; poly-diphenylacetylene; poly(t-butyl)diphenylacetylene; poly(tri-fluoromethyl)diphenylacetylene; polybis(trifluoromethyl) acetylene; polybis(t-butyldiphenyl)acetylene; poly (trimethylsilyl) diphenylacetylene; poly(carbazole) diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl)pheylacetylene; polydipyrrylmethane; polyindoqiunone; polydihydroxyindole; poly-trihydroxyindole; furane-polydihydroxyindole; polyindoqiunone-2-carboxyl; polyindoqiunone; polybenzo-bisthiazole; poly(p-phenylene sulfide); polyaniline; polythiophene; polypyrrole; polysilane; polystyrene; polyfuran; polyindole; polyazulene; polyphenylene; polyfluorenes, polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

Optionally, a thin conductive metal barrier layer may be formed over the memory element films. The thin conductive metal barrier may be of any suitable material. In one embodiment of the subject invention, the thin conductive metal barrier layer may be of titanium or titanium nitride. The thin conductive metal layer may be formed using any suitable technique. For example, CVD, PVD, evaporation, sputtering, and electro plating can be used.

Figure 13:
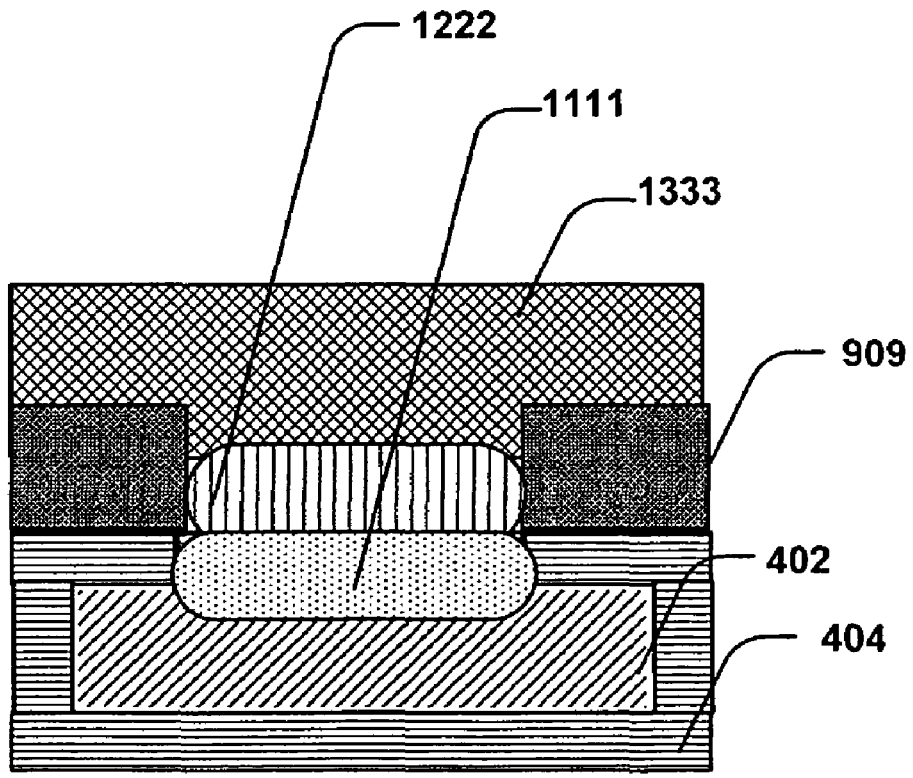

In one embodiment of the subject invention, a top electrode 1333 is formed over the active layer 1222. FIG. 13 shows a cross sectional illustration of a semicondcutor device with the top electrode 1333 formed over the memory element film 1222 and the dielectric layer 909. The top electrode 1333 is formed using methods known to one skilled in the art. For example, the top electrode 1333 is formed by depositing metals using techniques such as etching, evaporation, PVD, CVD, and PECVD. Optionally, additional layers such as etch stop layers, cap layers, insulating layers, dielectric layers, and the like may be formed before depositing the top electrode 1333.

The top electrode 1333 is made of conductive material; such as a conductive metal, conductive metal alloys, conductive metal oxides, conductive polymer films, semiconductive materials, and the like. Specific examples of materials for the top electrode 1333 include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

The thickness and width of the top electrode 1333 may depend upon the specific lithography and design rules. In one embodiment, the thickness of the top electrode 1333 is about 0.01 μm or more and about 10 μm or less. In another embodiment, the thickness of the top electrode 1333 is about 0.05 μm or more and about 5 μm or less. In yet another embodiment, the thickness of the top electrode is about 0.1 μm or more and about 1 μm or less.

One skilled in the art would recognize that the top electrode 1333 could be placed in a variety of positions without losing the advantages of the subject invention. The top electrode 1333 is patterned to form wordlines using standard techniques. It is to be understood that these acts may be repeated to provide a series of suitable layers and conductive paths over one another on the substrate.

The subject invention advantageously provides for deposition of passive layers with improved properties. Also, the subject invention mitigates and/or eliminates formation of copper voids under the dielectric layer. Thus, the subject invention provides for more efficient and cost effective fabrication of semiconductor devices.

Figure 14:
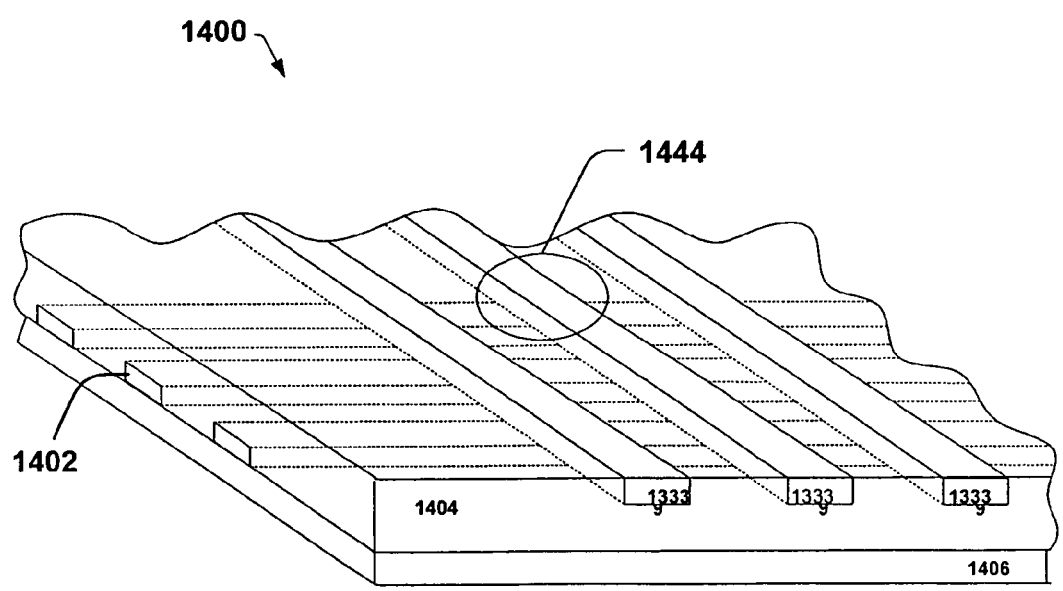
FIG. 14 is a memory device containing multiple memory cells fabricated according to one aspect of the subject invention.

According to another aspect of the subject invention, a memory device is provided, which exhibits improved performance. Referring to FIG. 14, a brief description of the memory device 1400 containing a plurality of memory cells positioned on or over a substrate in accordance with one aspect of the invention is shown. The memory device 1400 contains a desired number of memory cells, as determined by the number of rows, columns, and layers (three dimensional orientation described later) positioned on a substrate. The memory cells for memory device 1400 are formed in a first dielectric 1404 over a substrate 1406. The substrate 1406 for the device 1400 is similar in both material and in fabrication to the substrate used for the method 300 described earlier.

Figure 15:
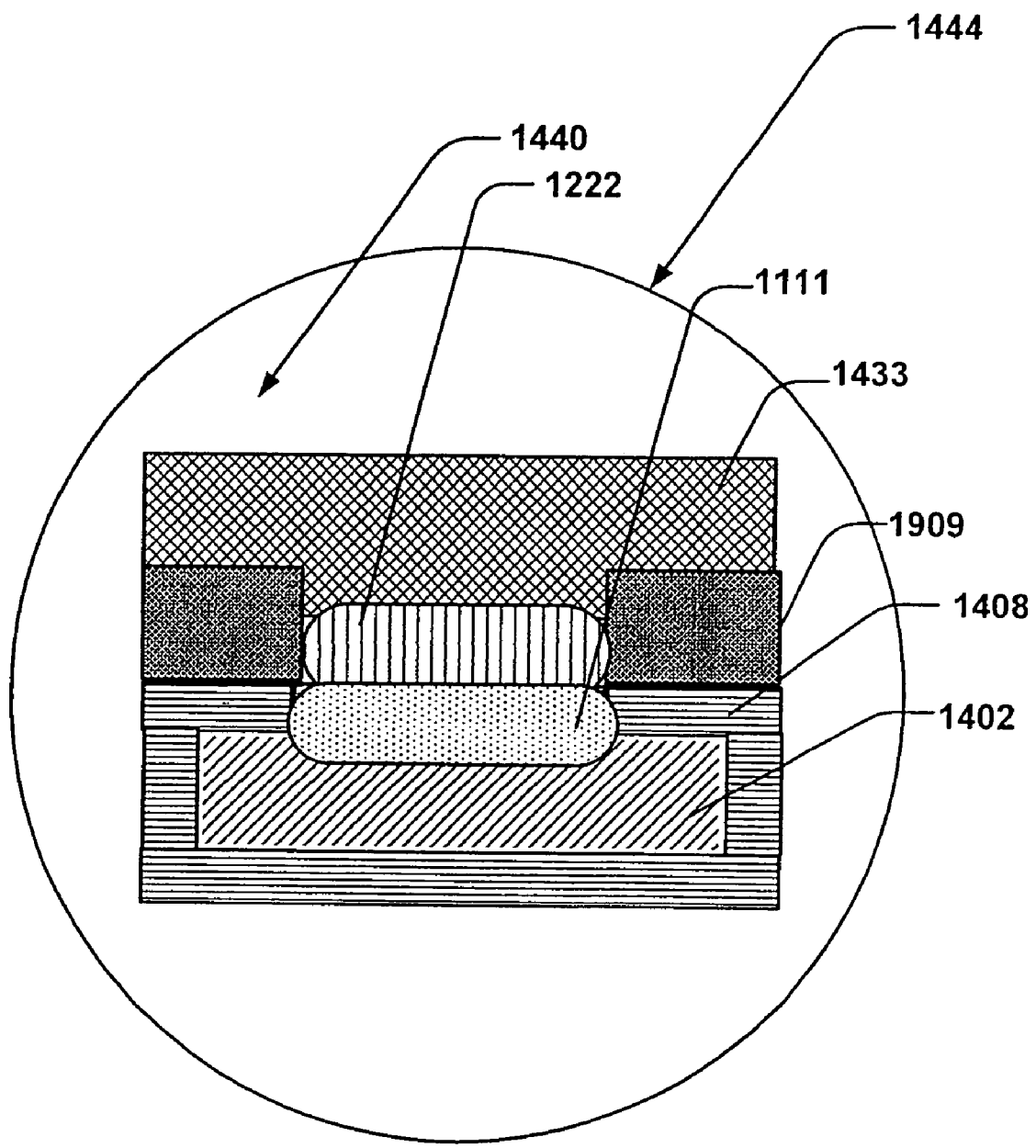
FIG. 15 is an exploded view of a memory cell of the memory device described in FIG. 14.

An exploded view 1444 of a memory cell 1440 shown in FIG. 15 and contains a bottom electrode 1402 surrounded by a Ta-containing cap 1408, memory element films containing a passive layer 1111 and an active layer 1222 formed in a via opening of a second dielectric layer 1909, and a top electrode 1433 adjacent to the active layer 1222. The substrate 1406, and the first dielectric layer 1404, peripheral circuitry and devices are not shown for brevity. The fabrication of these components have been described earlier during the discussion of method 300, and all techniques and materials described in relation to method 300 can also be used to manufacture device 1400.

The materials and the methods used to form the dielectric layer 909 can also be used to form the first dielectric layer 1404 and the second dielectric layer 1909. Similarly, the Ta-containing cap 1408 is similar in both materials and fabrication to the Ta-containing cap 808. The materials and procedures used to form bottom electrode 1402 are similar to the materials and methods used to form the copper containing metal line 402 of method 300. The top electrode 1433 is similar to the top electrode 1333 of method 300 in both materials and manufacture. The top electrode 1333 and the bottom electrode 402 are shown in substantially perpendicular orientation, although other orientations are possible to achieve the structure of the exploded view 1444. It is to be appreciated that persons skilled in the art can modify the materials and methods described above for the device 1400 without losing the advantages, and therefore, those enabling modifications are within the scope of the subject invention.

Operation of the polymer memory devices/cells is facilitated using an external stimulus to achieve a switching effect. The external stimuli include an external electric field and/or light radiation. Under various conditions, the polymer memory cell 1440 is either conductive (low impedance or "on" state) or non-conductive (high impedance or "off" state).

The semiconducting polymer layer 1222 along with the passive layer 1111 comprises controllably conductive media. The controllably conductive media can be rendered conductive or non-conductive in a controllable manner using an external stimulus. Generally, in the absence of an external stimulus, the controllably conductive media is non-conductive or has high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

The conductivity facilitating compound of the passive layer 1111 contributes to the controllably conductive properties of the controllably conductive media. The conductivity facilitating compound has the ability to donate and accept charges (holes and/or electrons) and/or act as a source of ions. Thus, the passive layer 1111 may transport holes, electrons, and/or ions between an electrode and the semiconducting polymer layer 1222/passive layer 1111 interface, facilitate charge/carrier injection into the organic semiconducting polymer layer 1222, and/or increase the concentration of a charge carrier (ions, holes and/or electrons) in the semiconducting polymer layer 1222. In some instances, the passive layer 1111 may store opposite charges thereby providing a balance of charges in the organic memory device as a whole. Storing charges/charge carriers is facilitated by the existence of two relatively stable oxidation states for the conductivity facilitating compound.

The subject invention as described advantageously provides for memory cells exhibiting improved reliability and increased performance. The subject invention achieves these advantages because of the Ta-cap over the upper surface of the metal line under the overlying dielectric layer which mitigates and/or eliminates lateral growth of memory element film and copper voids.

The methods and systems of improving conduction characteristics of a memory cell/device described in the subject invention are useful for any device requiring memory element. For example, the semiconducting devices with improved memory element are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A memory device comprising:
a substrate;
a bottom electrode formed in a first dielectric layer of the substrate;
a Ta-containing cap on an upper surface of the bottom electrode except in areas where memory element films are formed;
the memory element films formed in a via opening of a second dielectric layer and contacting the bottom electrode; and
a top electrode over the memory element films.

2. The memory device of claim 1, wherein the memory element films comprises a passive layer and an active layer.

3. The memory device of claim 2, wherein the passive layer comprises copper sulfide.

4. The memory device of claim 2, wherein the active layer comprises at least one of an organic semiconducting material and an inorganic semiconducting material.

5. The memory device of claim 2, wherein the active layer comprises at least one of poly(p-phenylene vinylene); polyporphyrins; polyvinylenes; polystiroles; polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polyfluorenes, polypyridine; and polybipyridine.

6. The memory device of claim 1, wherein the bottom electrode comprises copper.

7. The memory device of claim 1, wherein the Ta-containing cap comprises tantalum.

8. The memory device of claim 1, wherein the Ta-containing cap comprises at least one selected from alpha tantalum, beta tantalum, alpha-beta tantalum, compounds of tantalum, and alloys of tantalum.

9. The memory device of claim 1, wherein the Ta-containing cap comprises one of tantalum sulfide and tantalum nitride.

10. The memory device of claim 1, wherein the Ta-containing cap comprises one of (i) tantalum and tungsten and (ii) tantalum and titanium.

11. The memory device of claim 1, wherein the Ta-containing cap has a thickness from about 1 Å to about 1,000 Å.

12. A memory device comprising:
a substrate;
a bottom electrode comprising copper formed in a first dielectric layer of the substrate;
a Ta-containing capping layer on an upper surface of the bottom electrode except in areas where memory element films comprising a passive layer and an active layer are formed;
the memory element films formed in a via opening of a second dielectric layer and contacting the bottom electrode; and
a top electrode over the memory element films.

13. The memory device of claim 12, wherein the Ta-containing capping layer has a thickness from about 5 Å to about 500 Å.

14. The memory device of claim 12, wherein the Ta-containing capping layer comprises at least one selected from alpha tantalum, beta tantalum, alpha-beta tantalum, compounds of tantalum, and alloys of tantalum.

15. The memory device of claim 12, wherein the active layer comprises at least one of (i) polyphenylacetylene mixed with $Cu_2S$ and (ii) polyphenylacetylene mixed with $Cu_2O$.

16. A memory device comprising:
a substrate;
a bottom electrode formed in a first dielectric layer of the substrate;
a Ta-containing capping layer on an upper surface of the bottom electrode except in areas where memory element films comprising a passive layer and an active layer are formed, wherein the Ta-containing capping layer comprises at least one selected from alpha tantalum, beta tantalum, alpha-beta tantalum, compounds of tantalum, and alloys of tantalum;
the memory element films formed in a via opening of a second dielectric layer and contacting the bottom electrode; and
a top electrode over the memory element films.

17. The memory device of claim 16, wherein the Ta-containing capping layer has a thickness from about 1 Å to about 1,000 Å.

18. The memory device of claim 16, wherein the Ta-containing capping layer comprises one of (i) tantalum sulfide, (ii) tantalum nitride, (iii) tantalum and tungsten, and (iv) tantalum and titanium.

19. The memory device of claim 16, wherein the active layer comprises at least one of poly(p-phenylene vinylene); polyporphyrins; porphyrinic macrocycles; thiol-derivatized polyporphyrins; polymetallocenes; polyvinylenes; polystiroles; polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polyfluorenes, polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

* * * * *